(12) United States Patent
Zlotnik et al.

(10) Patent No.: US 12,044,711 B2
(45) Date of Patent: Jul. 23, 2024

(54) VOLTAGE TRACKING CIRCUIT

(71) Applicant: Micron Technology, Inc., Boise, ID (US)

(72) Inventors: Leon Zlotnik, Camino, CA (US); Leonid Minz, Beer Sheva (IL)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/824,479

(22) Filed: May 25, 2022

(65) Prior Publication Data
US 2023/0384353 A1  Nov. 30, 2023

(51) Int. Cl.
| | | |
|---|---|---|
| *G01R 19/00* | (2006.01) |
| *G11C 7/22* | (2006.01) |
| *H03K 5/14* | (2014.01) |
| *H03K 3/037* | (2006.01) |

(52) U.S. Cl.
CPC .......... *G01R 19/0038* (2013.01); *G11C 7/222* (2013.01); *H03K 5/14* (2013.01); *H03K 3/037* (2013.01)

(58) Field of Classification Search
None
See application file for complete search history.

(56) References Cited

U.S. PATENT DOCUMENTS

| | | |
|---|---|---|
| 3,430,070 A | 2/1969 | Marshall, Jr. et al. |
| 5,179,295 A | 1/1993 | Mattison et al. |
| 5,767,717 A | 6/1998 | Schorn et al. |
| 9,599,672 B2 | 3/2017 | Abhishek et al. |
| 2006/0294282 A1 | 12/2006 | Warner |
| 2017/0163268 A1* | 6/2017 | Maeda ................... H03L 7/0816 |
| 2019/0229736 A1* | 7/2019 | Kosonocky .............. H03K 5/14 |

* cited by examiner

*Primary Examiner* — Cassandra F Cox
(74) *Attorney, Agent, or Firm* — Brooks, Cameron & Huebsch, PLLC

(57) ABSTRACT

A voltage tracking circuit includes delay line blocks, a phase detector delay line block, phase detection circuitry, and a controller. The controller determines a first voltage based on a quantity of active delay line blocks among the plurality of delay line blocks and determines a second voltage based on information received from the phase detection circuitry. The controller determines a measured value of a voltage provided by the voltage regulator voltage based on the first voltage and the second voltage.

20 Claims, 5 Drawing Sheets

VOLTAGE TRACKING CIRCUIT

TECHNICAL FIELD

Embodiments of the disclosure relate generally to digital logic circuits, and more specifically, relate to a voltage tracking circuit.

BACKGROUND

A memory system can include one or more digital circuits that can include various circuitry. In general, a portion of the circuitry can provide a voltage signal to power the digital circuits and/or to power components of the memory system.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
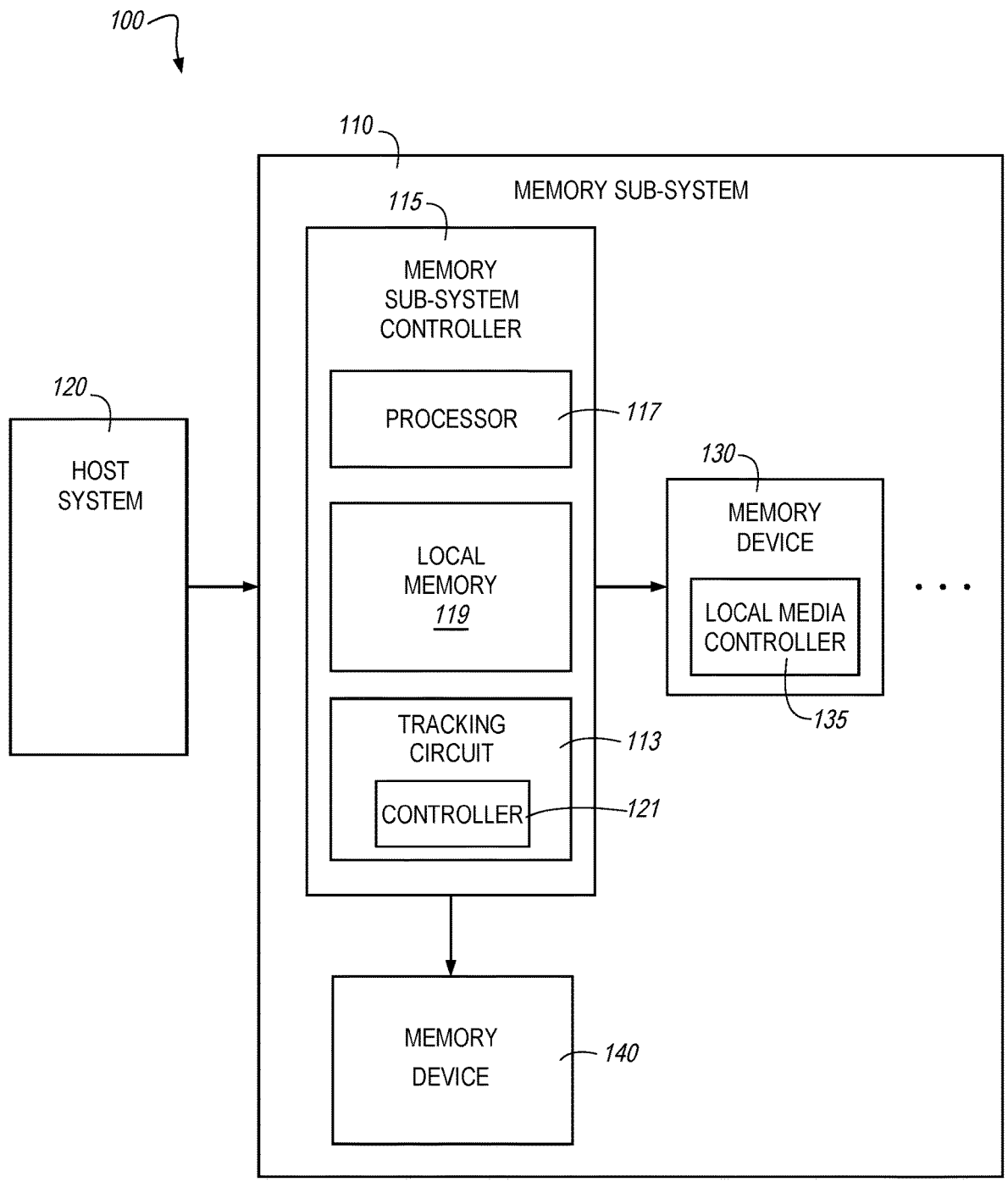
FIG. 1 illustrates an example computing system that includes a memory sub-system in accordance with some embodiments of the present disclosure.

Aspects of the present disclosure are directed to a voltage tracking circuit. The voltage tracking circuit can determine an accurate, instantaneous (or near-instantaneous) voltage associated with a system (e.g., a System-on-Chip (SoC), application-specific integrated circuit (ASIC), field-programmable gate array (FPGA), or other hardware circuitry) in order to reduce power consumption and/or to improve performance in the system in comparison to approaches that do not employ such voltage tracking circuits. Accordingly, the voltage tracking circuit(s) described herein can provide benefits in systems that rely on instantaneous (or near-instantaneous) voltage information to track, limit, adjust, and/or manipulate power consumption and/or noise dynamically. Examples of voltage tracking circuit(s) and other components that can be utilized to facilitate embodiments of the present disclosure are described below in conjunction with FIG. 1, et alibi.

The tracking circuit(s) (e.g., voltage tracking circuit(s), current tracking circuit(s), etc.) described herein can include various components (e.g., delay lines, phase detectors, control circuits, etc.) that can allow for accurate and timely (e.g., instantaneous or near-instantaneous) detection of voltages, currents, or other signaling associated with a SoC, ASIC, FPGA, or other such hardware circuitry. As described in more detail, herein, the tracking circuit(s) can include multiple delay line blocks that are coupled to a phase detector (PD) delay line block. The PD delay line block is coupled via taps to phase detection circuitry that includes multiple phase detector circuits (e.g., flip-flops). As used herein, the term "tap" generally refers to a contact point or physical connection between one or more components. The phase detection circuitry is coupled to a controller (e.g., a voltage tracking controller) that can determine an "actual" or measured voltage or associated current present in a system that includes the tracking circuit(s). In some embodiments, the tracking circuit(s) can be used to determine an actual (e.g., measured) voltage or current associated with the SoC, ASIC, FPGA, or other such hardware circuitry.

In some embodiments, the measured voltages, currents, or other signals can be determined based on multiple voltage measurements. For example, the measured voltages, currents, etc. can be determined using a coarse voltage measurement and a fine voltage measurement, among other possibilities. In embodiments in which a coarse voltage measurement and a fine voltage measurement are used to determine the measured voltage, information delay line blocks can be used to determine the coarse voltage measurement and information from phase detectors can be used to determine the fine voltage measurement, as described in more detail herein.

In addition, embodiments herein allow for a threshold voltage to be set for use by the voltage tracking circuit and/or components coupled thereto. For example, a magnitude of a voltage signal generated by one or more voltage regulators can be set as an actual (e.g., measured) voltage for use by the voltage tracking circuit and/or components coupled thereto. By comparing various parameters (e.g., delay line block characteristics, frequencies, phase shifts, etc.) that are determined by the components described herein (e.g., by the voltage tracking circuit and/or the constituent components thereof), it is possible to determine an accurate actual (e.g., measured) operational voltage and use this operational voltage in order to manipulate dynamic power consumption and/or noise in a system such as an automated power management system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

In other embodiments, the voltage sensing circuit 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a tracking circuit 113. Although not shown in FIG. 1 so as to not obfuscate the drawings, the tracking circuit 113 can include various circuitry to facilitate aspects of the disclosure described herein. In some embodiments, the tracking circuit 113 can include special purpose circuitry in the form of an ASIC, FPGA, state machine, and/or other logic circuitry that can allow the tracking circuit 113 to orchestrate and/or perform operations to determine measured voltages, currents, etc. using a coarse voltage measurement and a fine voltage measurement, among other possibilities. In some embodiments, the tracking circuit 113 can be used to track, limit, adjust, and/or manipulate power consumption and/or noise of components of components of the memory sub-system 110, the tracking circuit 113, and/or other components associated with the memory sub-system dynamically.

In some embodiments, the memory sub-system controller 115 includes at least a portion of the tracking circuitry 113. For example, the memory sub-system controller 115 can include a processor 117 (processing device) configured to execute instructions stored in local memory 119 for performing the operations described herein. In some embodiments, the tracking circuitry 113 is part of the host system 110, an application, or an operating system. The tracking circuit 113 can be resident on the memory sub-system 110 and/or the memory sub-system controller 115. As used herein, the term "resident on" refers to something that is physically located on a particular component. For example, the tracking circuit 113 being "resident on" the memory sub-system 110, for example, refers to a condition in which the hardware circuitry that comprises the tracking circuit 113 is physically located on the memory sub-system 110. The term "resident on" may be used interchangeably with other terms such as "deployed on" or "located on," herein.

In some embodiments, the tracking circuit 113 can include a controller 121. The controller 121 can be a local controller that controls operation of at least some functions of the tracking circuit 113. The controller 121 can include hardware circuitry and/or logic to control operation of at least some of the functions of the tracking circuit 113. The controller 121 can be analogous to the controller 221 illustrated in FIG. 2, herein. Accordingly, in some embodiments, the controller 121 can be a voltage tracking controller, as described in more detail in connection with FIG. 2, et alibi.

Figure 2:
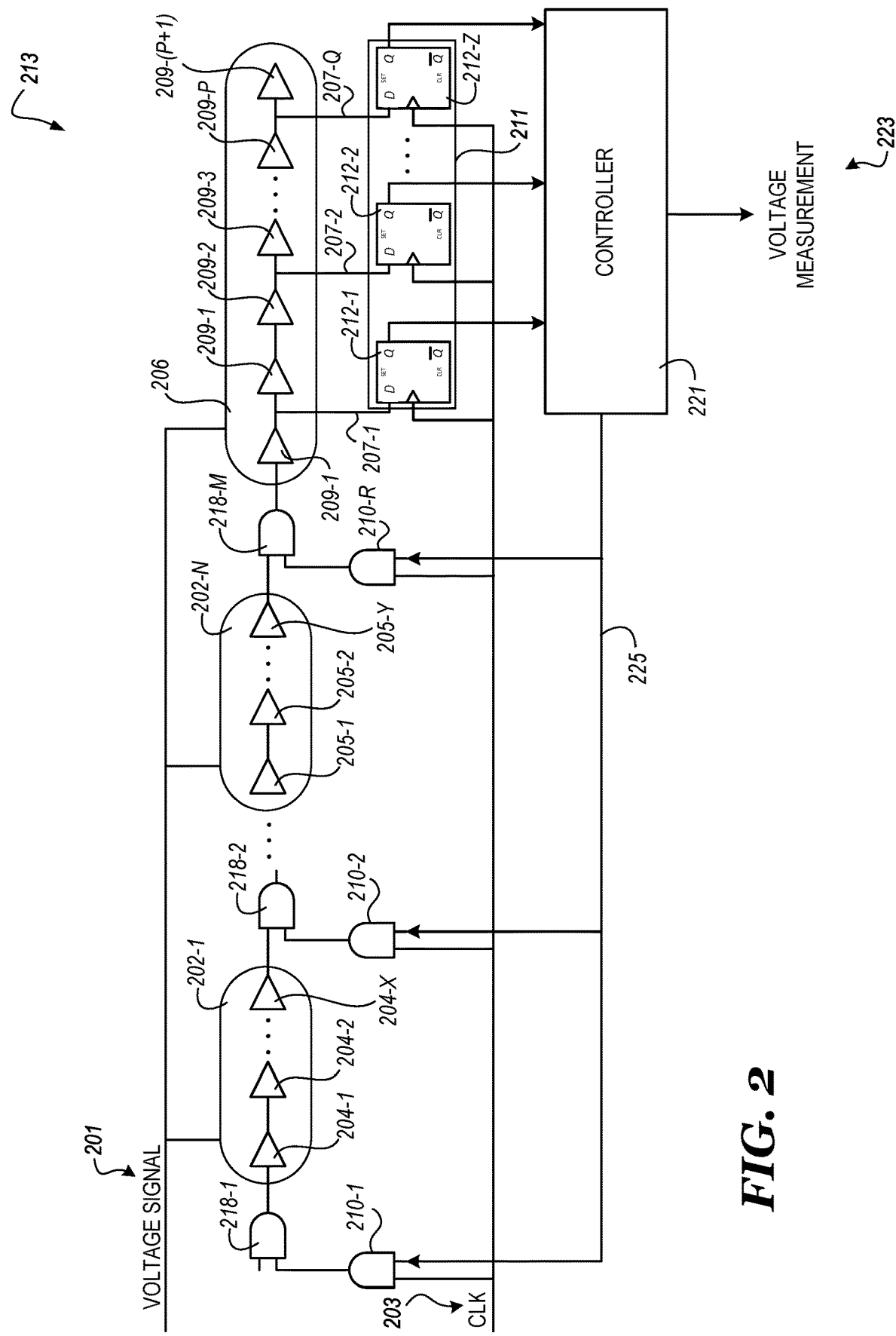
FIG. 2 illustrates an example system including a tracking circuit in accordance with some embodiments of the present disclosure.

FIG. 2 illustrates an example system including a tracking circuit (e.g., a voltage tracking circuit) 213 in accordance with some embodiments of the present disclosure. The example system, which can be referred to in the alternative as an "apparatus," includes a plurality of delay line blocks 202-1 to 202-N that are coupled to a phase detector (PD) delay line block 206. In some embodiments, the tracking circuit 213 can be analogous to the tracking circuit 113 illustrated in FIG. 1, herein.

The delay line blocks 202-1 to 202-N and/or the PD delay line block 206 can be analog delay lines or digital delay lines. In addition, the delay line blocks 202-1 to 202-N and/or the PD delay line block 206 can be fixed delay lines or variable delay lines. In general, the delay line blocks 202-1 to 202-N and/or the PD delay line block 206 are used to delay a signal (e.g., a clock ("CLK") signal 203) with respect to time. In some embodiments, the delay in the signal with respect to time can be determined in terms of a change in phase in the signal. The voltage signal 201 can be a voltage signal that is generated by a voltage supply device, such as a main power supply unit (e.g., the voltage regulator 429 illustrated in FIG. 4, herein) that provides power signals to the tracking circuit 213. Accordingly, the voltage signal 201 can be a voltage signal that is supplied via a rail of a power supply unit, although embodiments are not so limited.

As shown in FIG. 2, each of the delay line blocks 202-1 to 202-N includes a plurality of circuit elements 204-1 to 204-X and 205-1 to 205-Y. For example, the delay line block 202-1 includes circuit elements 204-1 to 204-X while the delay line block 202-N includes circuit elements 205-1 to 205-Y. The PD delay line block 206 includes circuit elements 209-1 to 209-(P+1). In some embodiments, the quantity of circuit elements 209-1 to 209-(P+1) associated with the PD delay line block 206 is greater than the quantity of circuit elements 204-1 to 204-X associated with the delay line block 202-1 and/or the quantity of circuit elements 205-1 to 205-Y associated with the delay line block 202-N. In some embodiments, the circuit elements 204-1 to 204-X and/or the circuit elements 205-1 to 205-Y can be buffers, although embodiments are not so limited.

The PD delay line block 206 is coupled to phase detection circuitry 211, which includes a plurality of phase detectors 212-1 to 212-Z, via a plurality of taps 207-1 to 207-Q. In addition, the phase detectors 212-1 to 212-Z receive a clock signal (the "CLK" 203) during operation. The phase detectors 212-1 to 212-Z are coupled to a controller (e.g., a voltage tracking controller) 221. The controller 221, which can be analogous to the controller 121 illustrated in FIG. 1, can transfer signaling to multiplexers 210-1 to 210-R via the signal path 225 to selectively activate one or more of the delay line blocks 202-1 to 202-N. Further, the controller 221 can be configured to determine a voltage measurement, as indicated at 223.

The tracking circuit 213 further includes multiplexers 218-1 to 218-M that couple the multiplexers 210-1 to 210-R and the delay line blocks 202-1 to 202-N. By operating the multiplexers 210-1 to 210-R and/or the multiplexers 218-1 to 218-M (e.g., by application of signaling to the inputs of the multiplexers 210-1 to 210-R and/or the multiplexers 218-1 to 218-M), various combinations of the delay line blocks 202-1 to 202-N can be enabled and/or disabled.

Further, in some embodiments, by operating the multiplexers 210-1 to 210-R (e.g., by application of signaling to the inputs of the multiplexers 210-1 to 210-R) in particular combinations, it can be possible to allow the phase detection circuitry 211 and/or one or more of the phase detectors 212-1 to 212-Z to be able to capture a positive phase or a negative phase via the taps 207-1 to 207-Q coupling the PD delay line block 206 to the phase detection circuitry 211.

As an example, each of the phase detectors 212-1 to 212-Z can determine either a positive phase or a negative phase associated with a signal received thereto. Based on the number of phase detectors 212-1 to 212-Z that determine a positive phase and a number of phase detectors 212-1 to 212-Z that determine a negative phase, the controller 221 can determine whether a greater number of phase detectors 212-1 to 212-Z have determined a positive phase associated with the signaling or whether a greater number of phase detectors 212-1 to 212-Z have determined a negative phase associated with the signaling. When a greater number of phase detectors 212-1 to 212-Z have determined a positive phase associated with the signaling or a greater number of phase detectors 212-1 to 212-Z have determined a negative phase associated with the signaling, the controller 221 can determine a cross-point for the phase detection circuitry 211 that corresponds to a number of taps 207-1 to 207-Q and, from this information, can determine a total number of circuit elements 209-1 to 209-(P+1) of the PD delay line 206 that should be enabled to set a fine delay, which in turn corresponds to the fine voltage measurement described herein. If the controller 221 is unable to detect the cross-point for the phase detectors 212-1 to 212-Z (i.e., when all the phase detectors 212-1 to 212-Z either determine a positive phase or a negative phase), the controller 221 can adjust the number of circuit elements 209-1 to 209-(P+1) that are enabled until at least one of the phase detectors 212-1 to 212-Z determines an opposite phase (e.g., when at least one phase detector 212-1 to 212-Z determines a negative phase when all the other phase detectors 212-1 to 212-Z determine a positive phase or vice versa) such that the cross-point is detected between the taps 207-1 to 207-Q.

Stated alternatively, a determination can be made that a phase detected by one or more of the phase detectors 212-1 to 212-Z is "positive" (i.e., the phase is late) or "negative" (i.e., the phase is early). Accordingly, the phase detected by the phase detectors 212-1 to 212-Z can be a simple value such as a logical "1" or a logical "0." For example, a positive phase can be indicated by a logical value of "1" and a negative phase can be indicated by a logical value of "0," as described in more detail below. As a result, embodiments herein do not require determination of a phase difference between detected phases and can operate based on detection of a positive phase (e.g., a logical value of "1") or detection of a negative phase (e.g., a logical value of "0").

As described in another example below, the controller 221 can determine when the number of phase detectors 212-1 to 212-Z that detect a negative phase is greater than the number of phase detectors 212-1 to 212-Z that detect a positive phase and can, in some embodiments, determine a cross-point among the taps 207-1 to 207-Q. The controller 221 can then determine how many taps 207-1 to 207-Q are required to determine the fine delay described herein. If the controller 221 is unable to detect the cross-point (i.e., all the indications from the phase detectors are either positive or negative) the controller 221 can adjust the number of enabled delay lines 202-1 to 202-N and/or 206 until the cross-point comes becomes visible (e.g., until at least one of the phase detectors detects a phase that is different from the rest of the phase detectors).

The terms "late" and "early," with respect to a detected phase are generally meant to describe a time at which a peak of a sinusoidally varying wave function is offset with respect to an "ideal" or expected sinusoidally varying wave function. For example, detection of a "positive phase" can indicate that one or more of the signals described herein are phase shifted such that a peak of the wave function associated with the signal is detected later than expected if the signal (and corresponding sinusoidally varying wave function) was ideal. Similarly, detection of a "negative phase" can indicate that one or more of the signals described herein are phase shifted such that a peak of the wave function associated with the signal is detected earlier than expected if the signal (and corresponding sinusoidally varying wave function) was ideal.

Figure 4:
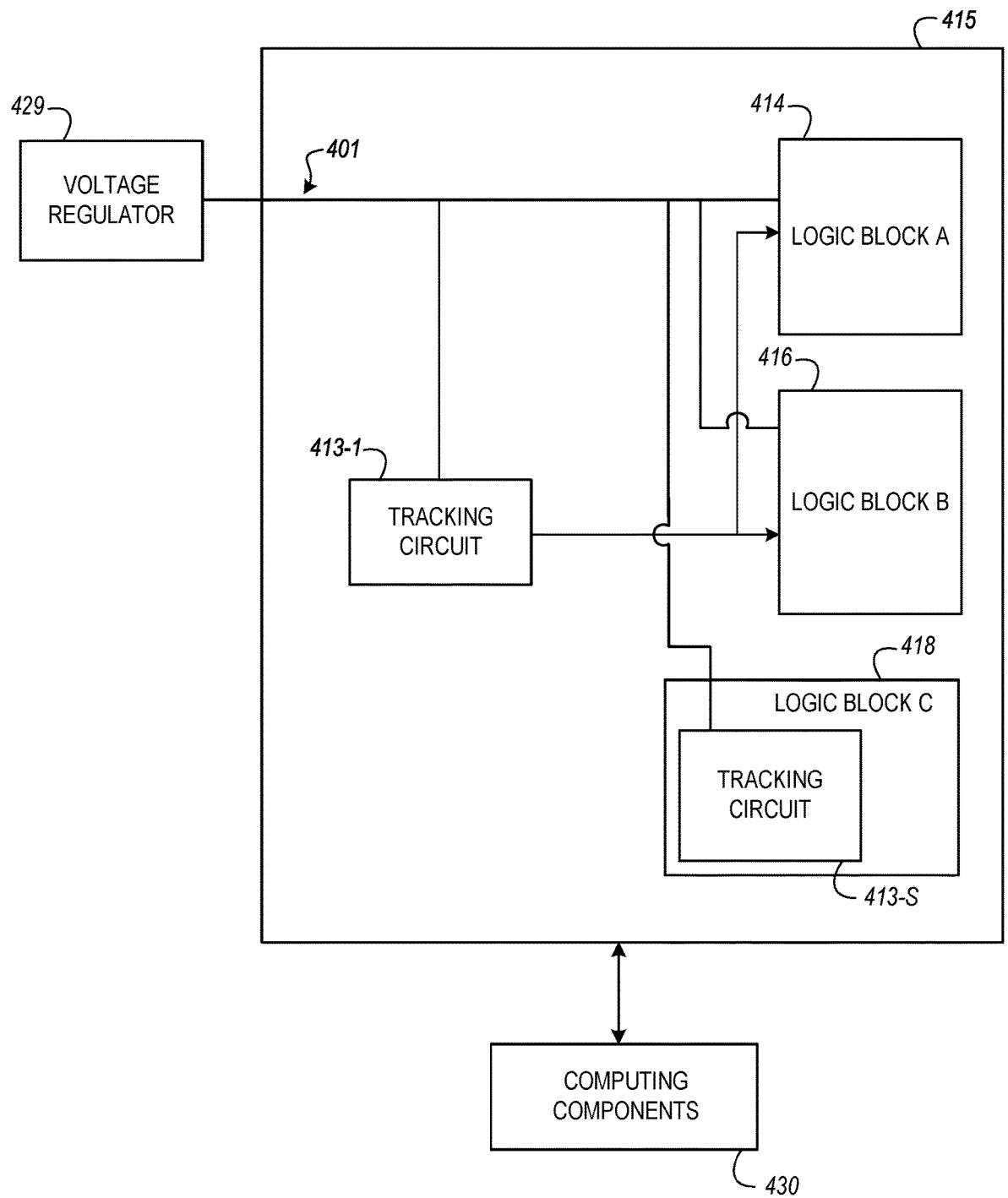
FIG. 4 illustrates an example memory sub-system controller including a tracking circuit in accordance with some embodiments of the present disclosure.

In a non-limiting example, an apparatus (e.g., the tracking circuit 213) includes a plurality of delay line blocks 202-1 to 202-N powered by a voltage regulator (e.g., the voltage regulator 429 illustrated in FIG. 4). The apparatus further includes a phase detector (PD) delay line block 206 coupled to the plurality of delay line blocks 202-1 to 202-N and powered by the voltage regulator. In some embodiments, each of the delay line blocks among the plurality of delay line blocks 202-1 to 202-N contains fewer circuit elements 204-1 to 204-X/205-1 to 205-Y than a quantity of circuit elements 209-1 to 209-(P+1) contained in the PD delay line block 206.

The apparatus further includes phase detection circuitry 211 comprising a plurality of phase detector circuits 212-1 to 212-Z. The phase detection circuitry 211 can be coupled to the PD delay line block 206. For example, in one or more embodiments, one or more circuit elements 209-1 to 209-(P+1) of the PD delay line block 206 are coupled to each phase detector circuit 212-1 to 212-Z among the plurality of phase detector circuits 212-1 to 212-Z of the phase detection circuitry 211 via respective taps 207-1 to 207-Q. The apparatus can further include a controller 221 coupled to the phase detection circuitry 211.

Continuing with this example, the controller 221 can determine a first voltage based on a quantity of active delay line blocks among the plurality of delay line blocks 202-1 to 202-N. Whether or not the delay line blocks 202-1 to 202-N are "active" refers to whether signaling is applied to the inputs of the multiplexers 210-1 to 210-R and/or the multiplexers 218-1 to 218-M. For example, in some embodiments, controller 221 can dynamically select the number of delay line blocks that are enabled among the plurality of delay line blocks 202-1 to 202-N by applying signaling via the signal path 225 to one or more of the multiplexers 210-1 to 210-R thereby enabling a respective one or more of the plurality of delay line blocks 202-1 to 202-N.

The controller 211 can further determine a second voltage based on information received from the phase detection circuitry 211. For example, in some embodiments, the controller 221 can activate a subset of the delay line blocks among the plurality of delay line blocks 202-1 to 202-N such that each phase detector circuit 212-1 to 212-Z of the phase detection circuitry 211 determines either a positive phase or a negative phase from signaling received via the respective taps 207-1 to 207-Q. In such embodiments, the controller 221 can determine the second voltage based on a number of phase detector circuits 212-1 to 212-Z that have a positive phase associated therewith and a number of phase detector circuits 212-1 to 212-Z that have a negative phase associated therewith.

For example, the controller 221 can determine a cross-point between phase detectors circuits 212-1 to 212-Z that detect a positive phase and phase detector circuits 212-1 to 212-Z that detect a negative phase from the voltage signal 201 after the voltage signal 201 has passed through the delay line block(s) 202-1 to 202-N and the PD delay line block 206. In some embodiments, the cross-point can be associated with a quantity of the phase detectors 212-1 to 212-Z that detect a positive phase that are adjacent to phase detectors 212-1 to 212-Z that detect a negative phase from the voltage signal 201 after the voltage signal 201 has passed through the delay line block(s) 202-1 to 202-N and the PD delay line block 206.

As used herein, the term "cross-point" generally refers to a voltage at which a first phase detector circuit 212-1 to 212-Z has an opposite phase than a second phase detector circuit 212-1 to 212-Z that is physically located next to the first phase detector circuit 212-1 to 212-Z. For example, if a phase detector circuit detecting a negative (e.g., early) phase is referred to as "PD=0" and a phase detector circuit detecting a positive (e.g., late) phase is referred to as "PD=1," a vector of determined phases for eight (8) phase detector circuits 212-1 to 212-Z could be [00000111]. In this example, the first five (5) phase detector circuits have detected a negative phase (e.g., "PD=0") and the last three (3) phase detector circuits have detected a positive phase (e.g., "PD=1"). In this example, the fine voltage corresponds to either a tap coupled to the fifth phase detector circuit or a tap coupled to the sixth phase detector circuit (e.g., the taps coupled to the phase detector circuits where the detected phase shifts from a negative phase to a positive phase). Accordingly, the cross-point can refer to the point at which the detected phase shifts from the negative phase to the positive phase. In some embodiments, the cross-point can correspond to a fine voltage associated with one or more of the taps 201-1 to 207-Q.

The controller 211 can further determine a measured value of a voltage provided by the voltage regulator based on the first voltage and the second voltage. In some embodiments, the measured value of the voltage provided by the voltage regulator can be a sum of the first voltage and the second voltage, although embodiments are not so limited.

In some embodiments, the apparatus includes respective multiplexers 210-1 to 210-R coupled to respective delay line blocks among the plurality of delay line blocks 202-1 to 202-N. In such embodiments, the controller 221 can be configured to apply signaling indicative of enabling one or more of the respective multiplexers 210-1 to 210-R to enable respective delay line blocks among the plurality of delay line blocks 202-1 to 202-N. For example, the controller 221 can select only particular delay line blocks (as opposed to all the delay line blocks) depending on how many delay line blocks 202-1 to 202-N are required to determine the measured voltage value discussed herein.

As mentioned above, in some embodiments, the plurality of delay line blocks 206-1 to 206-N, the PD delay line block 206, the phase detection circuitry 211, and the controller 221 are resident on a System-on-Chip (SoC). In such embodiments, the controller is configured to utilize the determined measured value of the voltage provided by the voltage regulator in connection with operation of the SoC to provide a regulated power signal to one or more components (e.g., the logic block A 414, the logic block B 416, and/or the logic block C 418 illustrated in FIG. 4, herein) of the SoC and/or to one or more computing components (e.g., the computing components 430 illustrated in FIG. 4, herein) external to the SoC.

In another non-limiting example, an apparatus (e.g., the tracking circuit 213) includes a plurality of delay line blocks 202-1 to 202-N powered by a voltage regulator (e.g., the voltage regulator 429 illustrated in FIG. 4) and each comprising a first quantity of circuit elements 204-1 to 204-X and/or 205-1 to 205-Y. The apparatus can further include a delay line block 206 (e.g., a phase detector (PD) delay line block) powered by the voltage regulator and comprising a second quantity of circuit elements 209-1 to 209-(P+1), the delay line block 206 comprising the second quantity of circuit elements 209-1 to 209-(P+1) can be coupled to the plurality of delay line blocks 202-1 to 202-N comprising the first quantity of circuit elements 204-1 to 204-X and/or 205-1 to 205-Y. In some embodiments, the second quantity of circuit elements 209-1 to 209-(P+1) is greater than the first quantity of circuit elements 204-1 to 204-Z and/or 205-1 to 205-Y.

Continuing with this example, the apparatus can include phase detection circuitry 211 comprising a plurality of phase detector circuits 212-1 to 212-Z, the phase detection circuitry 211 can be coupled to the delay line block 206 comprising the second quantity of circuit elements 209-1 to 209-(P+1) via a plurality of taps 207-1 to 207-Q. As shown in FIG. 2, a controller 221 can be coupled to the phase detection circuitry 211.

The controller 221 can determine a quantity of active delay line blocks 202-1 to 202-N among the plurality of delay line blocks 202-1 to 202-N comprising the first quantity of circuit elements 204-1 to 204-X and/or 205-1 to 205-Y. The controller 221 can determine a coarse voltage measurement based on the quantity of active delay line blocks 202-1 to 202-N among the plurality of delay line blocks 202-1 to 202-N comprising the first quantity of circuit elements 204-1 to 204-X and/or 205-1 to 205-Y. The controller 221 can further determine a fine voltage measurement based on information received from the phase detection circuitry 211. The controller 221 can then determine a measured value of a voltage provided by the voltage regulator based on the coarse voltage measurement and the fine voltage measurement.

Continuing with this example, the controller 221 can activate the quantity of delay line blocks 202-1 to 202-N among the plurality of delay line blocks 202-1 to 202-N comprising the first quantity of circuit elements 204-1 to 204-Y and/or 205-1 to 205-Y such that each phase detector circuit 212-1 to 212-Z of the phase detection circuitry 211 is enabled to determine a positive phase or a negative phase from signaling received via the plurality of taps 207-1 to 207-Q. In some embodiments, the controller 221 can be further configured to determine the fine voltage measurement based on a quantity of phase detector circuits 212-1 to 212-Z that have a positive phase associated therewith and a quantity of phase detector circuits 212-1 to 212-Z that have a negative phase associated therewith (e.g., based on the "cross-point" described herein).

As mentioned above, the apparatus can be resident on a System-on-Chip (SoC). In such embodiments, the controller 221 can be configured to utilize the determined measured value of the voltage in connection with operation of the SoC to alter an amount of power used by the SoC. Embodiments are not so limited, however, and in some embodiments where the apparatus is resident on a SoC, the controller 221 can be configured to utilize the determined measured value of the voltage in connection with operation of the SoC to provide a regulated power signal to one or more components (e.g., the logic blocks illustrated in FIG. 4) of the SoC and/or components external to the SoC (e.g., the computing components 430 illustrated in FIG. 4).

Figure 3:
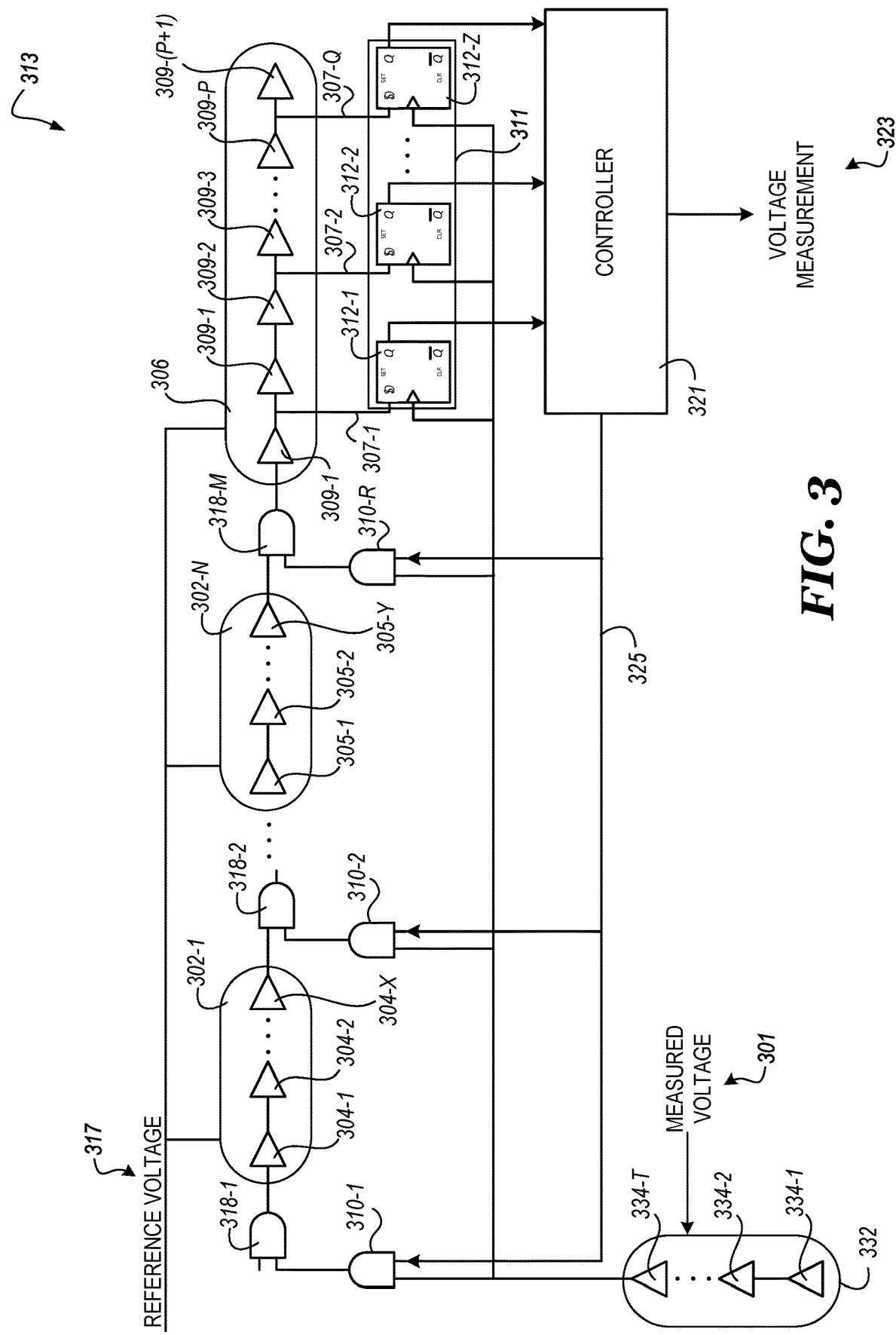
FIG. 3 illustrates another example system including a tracking circuit in accordance with some embodiments of the present disclosure.

FIG. 3 illustrates another example system including a tracking circuit (e.g., a voltage tracking circuit) 313 in accordance with some embodiments of the present disclosure. The example system, which can be referred to in the alternative as an "apparatus," includes a plurality of delay line blocks 302-1 to 302-N that are coupled to a phase detector (PD) delay line block 306. In some embodiments, the tracking circuit 313 can be analogous to the tracking circuit 113 illustrated in FIG. 1 and/or the tracking circuit 213 illustrated in FIG. 2, herein.

The components shown in FIG. 3 are analogous to those illustrated in FIG. 2; however, in FIG. 3, the voltage signal 301 (which can be analogous to the voltage signal 201 illustrated in FIG. 2) is applied to a free-running oscillator 332. In general, a "free-running" oscillator is an oscillator that operates in the absence of a clock signal). In addition, as shown in FIG. 3, a reference voltage 317 is applied to the PD delay line block 306 in contrast with FIG. 2 which illustrates the voltage signal being applied to the PD delay line block 306.

In general, using the tracking circuit 313 illustrated in FIG. 3, a detected frequency changes with the voltage signal 301, whereas in FIG. 2, a detected delay changes with the voltage signal (e.g., the voltage signal 201). However, the voltage tracking principles described herein are generally applicable overall to both the embodiment shown in FIG. 2 and the embodiments shown in FIG. 3.

In a non-limiting example, an apparatus, an apparatus (e.g., the tracking circuit 313) includes a plurality of delay line blocks 302-1 to 302-N that are configured to receive a signal (e.g., a clock signal that varies with the measured voltage 301) from a free-running oscillator circuit 332. The delay line blocks 302-1 to 302-N can each comprise a first quantity of circuit elements 304-1 to 304-X and/or 305-1 to 305-Y. The apparatus can further include a delay line block 306 (e.g., a phase detector (PD) delay line block) that is powered by a voltage regulator and is configured to receive the signal from the free-running oscillator circuit 332. The PD delay line block 306 can comprise a second quantity of circuit elements 309-1 to 309-(P+1) and can be coupled to the plurality of delay line blocks 302-1 to 302-N comprising the first quantity of circuit elements 304-1 to 304-X and/or 305-1 to 305-Y. In some embodiments, the second quantity of circuit elements 309-1 to 309-(P+1) is greater than the first quantity of circuit elements 304-1 to 304-Z and/or 305-1 to 305-Y.

Continuing with this example, the apparatus can include phase detection circuitry 311 comprising a plurality of phase detector circuits 312-1 to 312-Z, the phase detection circuitry 311 can be coupled to the delay line block 306 comprising the second quantity of circuit elements 309-1 to 309-(P+1) via a plurality of taps 307-1 to 307-Q. As shown in FIG. 3, a controller 321 can be coupled to the phase detection circuitry 311.

The controller 321 can determine a quantity of active delay line blocks 302-1 to 302-N among the plurality of delay line blocks 302-1 to 302-N comprising the first quantity of circuit elements 304-1 to 304-X and/or 305-1 to 305-Y. The controller 321 can determine a coarse voltage measurement based on the quantity of active delay line blocks 302-1 to 302-N among the plurality of delay line blocks 302-1 to 302-N comprising the first quantity of circuit elements 304-1 to 304-X and/or 305-1 to 305-Y. The controller 321 can further determine a fine voltage measurement based on information received from the phase detection circuitry 311. The controller 321 can then determine an actual value of the measured voltage 301 based on the coarse voltage measurement and the fine voltage measurement. As described above, the "actual voltage" can correspond to a voltage value that is physically active within the apparatus at an instantaneous time and can therefore account for various fluctuations in a voltage signal that can arise due to workloads, process variations, temperature fluctuations, and/or other uncertainties introduced to the apparatus during the course of operation of the apparatus.

Continuing with this example, the controller 321 can activate the quantity of delay line blocks 302-1 to 302-N among the plurality of delay line blocks 302-1 to 302-N comprising the first quantity of circuit elements 304-1 to 304-Y and/or 305-1 to 305-Y such that each phase detector circuit 312-1 to 312-Z of the phase detection circuitry 311 is enabled to determine a positive phase or a negative phase from signaling received via the plurality of taps 307-1 to 307-Q. In some embodiments, the controller 321 can be further configured to determine the fine voltage measurement based on a quantity of phase detector circuits 312-1 to 312-Z that have a positive phase associated therewith and a quantity of phase detector circuits 312-1 to 312-Z that have a negative phase associated therewith (e.g., based on the "cross-point" described herein).

As mentioned above, the apparatus can be resident on a System-on-Chip (SoC). In such embodiments, the controller 321 can be configured to utilize the determined measured value of the voltage in connection with operation of the SoC to alter an amount of power used by the SoC. Embodiments are not so limited, however, and in some embodiments where the apparatus is resident on a SoC, the controller 321 can be configured to utilize the determined measured value of the voltage in connection with operation of the SoC to provide a regulated power signal to one or more components (e.g., the logic blocks illustrated in FIG. 4) of the SoC and/or components external to the SoC (e.g., the computing components 430 illustrated in FIG. 4).

FIG. 4 illustrates an example memory sub-system controller 415 including a tracking circuit 313 in accordance with some embodiments of the present disclosure. The memory sub-system controller 415 can be analogous to the memory sub-system controller 115 illustrated in FIG. 1 and the tracking circuit 413 can be analogous to the tracking circuit 113 illustrated in FIG. 1, the tracking circuit 213 illustrated in FIG. 2, and/or the tracking circuit 313 illustrated in FIG. 3. Accordingly, the voltage tracking circuit 413-1 and/or 413-S can include a plurality of delay line blocks (e.g., the delay line blocks 202-1 to 202-N illustrated in FIG. 2 that are coupled to a phase detector (PD) delay line block (e.g., the PD delay line block 206 illustrated in FIG. 2). In addition, the voltage tracking circuit 413-1 and/or 413-S can include a controller (e.g., the controller 221 illustrated in FIG. 2), a phase detection circuit (e.g., the phase detection circuitry 211 illustrated in FIG. 2), and/or the various circuit elements and/or circuit components illustrated and described in connection with FIG. 2, herein.

As shown in FIG. 4, the voltage regulator 429 is configured to generate and apply a power supply signal (e.g., the voltage signal 201 illustrated in FIG. 2) to one or more logic blocks (i.e., the logic block A 414, the logic block B 416, and/or the logic block C 418). The logic block A 414, the logic block B 416, and/or the logic block C 418 can include various hardware that form one or more cores (e.g., "intellectual property (IP) cores"). As used herein, a "core" or "IP core" generally refers to one or more blocks of data and/or logic that form constituent components of an application-specific integrated circuit or field-programmable gate array. The logic block A 414, the logic block B 416, and/or the logic block C 418 can be designed, built, and/or otherwise configured to perform specific tasks and/or functions within the systems described herein. In some embodiments, the tracking circuit 413-1 and/or 413-S can take an action (or cause an action to be taken) to track, limit, adjust or manipulate the dynamic power available to the tracking circuit 413-1 and/or 413-S to provide voltage manipulation to the logic block A 414, the logic block B 416, and/or the logic block C 418 and/or to the computing components 430.

The memory sub-system 415 can be coupled to one or more computing components 430. The computing components 430 are generally external to the memory sub-system controller 415 and/or the tracking circuits 413-1 to 413-S (i.e., the computing components 430 are physically distinct from a chip, such a SoC that, at minimum, the tracking circuits 413-1 to 413-S are deployed on) but are communicatively couplable to the tracking circuits 413-1 to 413-S such that signaling can be exchanged between the memory sub-system controller 415 and/or the tracking circuits 413-1 to 413-S and the computing components 430. Non-limiting examples of the computing components 430 can include controllers, memory devices, graphics processing units, processors/co-processors, and/or logic blocks, among others that are connected to a computer in which the memory sub-system 415 and/or the tracking circuits 413-1 to 413-S operate.

Figure 5:
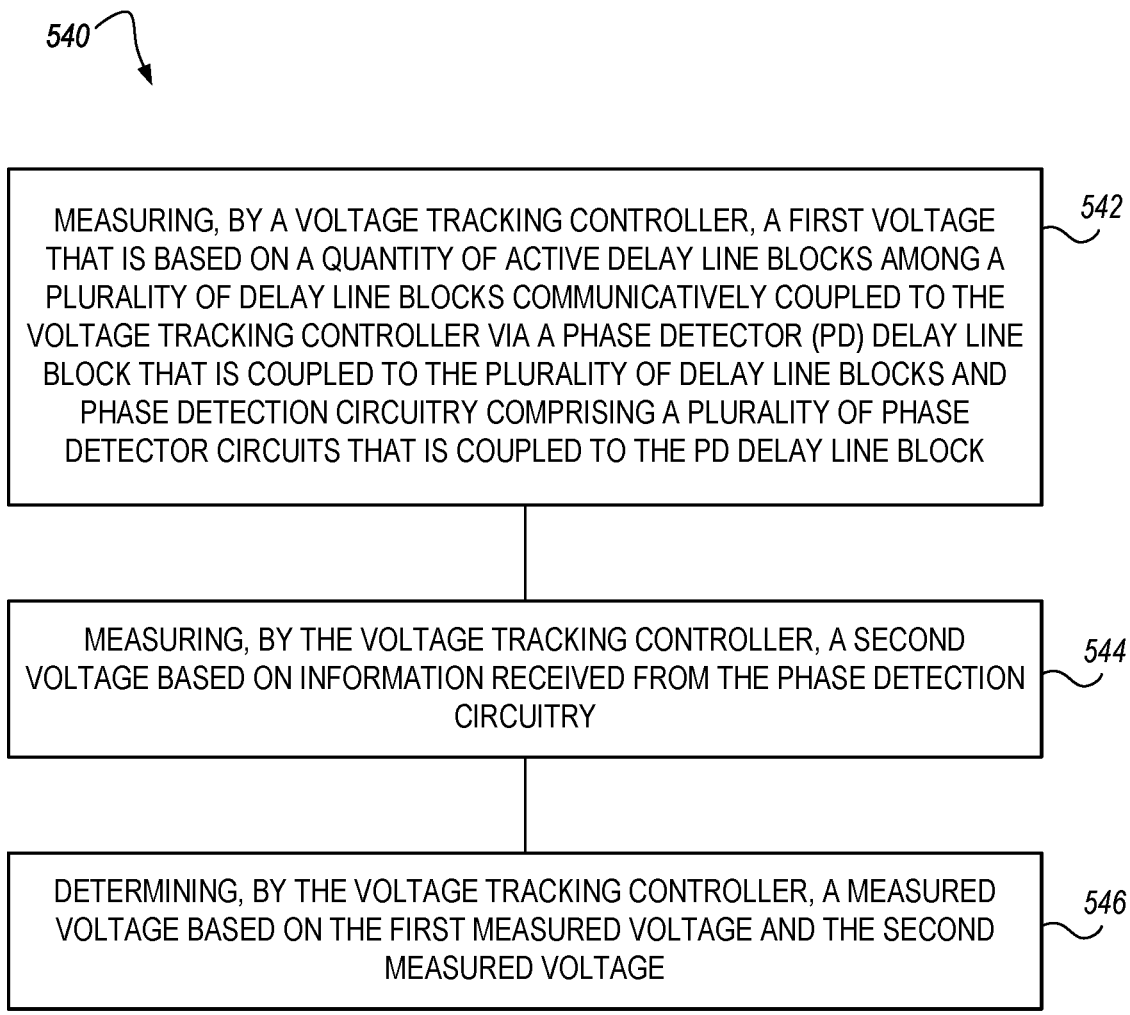
FIG. 5 is a flow diagram corresponding to a method for a voltage tracking circuit in accordance with some embodiments of the present disclosure.

FIG. 5 is a flow diagram corresponding to a method 540 for a voltage sensing circuit in accordance with some embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the tracking circuit 113 of FIG. 1, the tracking circuit 213 of FIG. 2, and/or the tracking circuit 313 illustrated in FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 542, the method 540 can include measuring, by a voltage tracking controller (e.g., the controller 121 illustrated in FIG. 1 and/or the controller 221 illustrated in FIG. 2, herein), a first voltage that is based on a quantity of active delay line blocks among a plurality of delay line blocks (e.g., the delay line blocks 202-1 to 202-N illustrated in FIG. 2) communicatively coupled to the voltage tracking controller via a phase detector (PD) delay line block (e.g., the PD delay line block 206 illustrated in FIG. 2) that is coupled to the plurality of delay line blocks and phase detection circuitry (e.g., the phase detection circuitry 211 illustrated in FIG. 2) comprising a plurality of phase detector circuits (e.g., the phase detector circuits 212-1 to 212-Z illustrated in FIG. 2) that is coupled to the PD delay line block. In some embodiments, the method 540 includes measuring the first voltage based on a quantity of phase detector circuits that have a positive phase associated therewith and a quantity of phase detector circuits that have a negative phase associated therewith.

At operation 544, the method 540 can include measuring, by the voltage tracking controller, a second voltage based on information received from the phase detection circuitry. The method 540 can, in some embodiments, include receiving, by the phase detection circuitry, signaling from the PD delay line block via respective taps (e.g., the taps 207-1 to 207-Q illustrated in FIG. 2). In such embodiments, a quantity of circuit elements of the PD delay line block coupled to the respective taps is less than a quantity of phase detector circuits of the phase detection circuitry coupled to the respective taps.

At operation 546, the method 540 can include determining, by the voltage tracking controller, a measured voltage based on the first measured voltage and the second measured voltage. In some embodiments, the measured voltage can be analogous to the voltage measurement 223 illustrated in FIG. 2, herein.

The method 540 can further include activating a subset of the delay line blocks among the plurality of delay line blocks such that each phase detector circuit of the phase detection circuitry determines both a positive phase and a negative phase from signaling received via the PD delay line block or the phase detection circuitry, or both.

The method 540 can further include measuring the second voltage based on a crosspoint between a negative phase of at least a first phase detector circuit of the phase detection circuitry and a positive phase of at least a second phase detector circuit of the phase detection circuitry. The crosspoint between the negative phase of the first phase detector circuit of the phase detection circuitry and the positive phase of at least a second phase detector circuit of the phase detection circuitry can correspond to a voltage (e.g., a voltage applied to the taps described above) that corresponds to a voltage value at which the phase detected by the first phase detector circuit shifts from a negative phase to a positive phase detected by the second phase detector, as described above.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a plurality of delay line blocks powered by a voltage regulator;
a phase detector (PD) delay line block coupled to the plurality of delay line blocks and powered by the voltage regulator;
phase detection circuitry coupled to the PD delay line block; and
a controller coupled to the phase detection circuitry, wherein the controller is configured to:
determine a first voltage based on a quantity of active delay line blocks among the plurality of delay line blocks;
determine a second voltage based on information received from the phase detection circuitry; and
determine a measured value of a voltage provided by the voltage regulator based on the first voltage and the second voltage.

2. The apparatus of claim 1, wherein each of the delay line blocks among the plurality of delay line blocks contains fewer circuit elements than a quantity of circuit elements contained in the PD delay line block.

3. The apparatus of claim 1, wherein the phase detection circuitry comprises a plurality of phase detector circuits.

4. The apparatus of claim 3, wherein one or more circuit elements of with the PD delay line block are coupled to each phase detector circuit among the plurality of phase detector circuits of the phase detection circuitry via respective taps.

5. The apparatus of claim 4, wherein the controller is further configured to activate a subset of the delay line blocks among the plurality of delay line blocks such that each phase detector circuit of the phase detection circuitry determines both a positive phase and a negative phase from signaling received via the respective taps.

6. The apparatus of claim 5, wherein the controller is further configured to determine the second voltage based on a quantity of phase detector circuits that have a positive phase associated therewith and a quantity of phase detector circuits that have a negative phase associated therewith.

7. The apparatus of claim 1, wherein:
the plurality of delay line blocks, the PD delay line block, the phase detection circuitry, and the controller are resident on a System-on-Chip (SoC), and
the controller is configured to utilize the determined measured value of the voltage provided by the voltage regulator in connection with operation of the SoC to provide a regulated power signal to one or more components of the SoC.

8. The apparatus of claim 1, further comprising respective multiplexers coupled to respective delay line blocks among the plurality of delay line blocks, wherein the controller is configured to apply signaling indicative of enabling one or more of the respective multiplexers to enable respective delay line blocks among the plurality of delay line blocks.

9. An apparatus, comprising:
a plurality of delay line blocks each comprising a first quantity of circuit elements, wherein delay line blocks among the plurality of delay line blocks are configured to receive a signal from a free-running oscillator circuit;

a delay line block comprising a second quantity of circuit elements, the delay line block comprising the second quantity of circuit elements being coupled to the plurality of delay line blocks comprising the first quantity of circuit elements;

phase detection circuitry comprising a plurality of phase detector circuits, the phase detection circuitry being coupled to the delay line block comprising the second quantity of circuit elements via a plurality of taps; and a controller coupled to the phase detection circuitry, wherein the controller is configured to:
- determine a quantity of active delay line blocks among the plurality of delay line blocks comprising the first quantity of circuit elements;
- determine a coarse voltage measurement based on the quantity of active delay line blocks among the plurality of delay line blocks comprising the first quantity of circuit elements,
- determine a fine voltage measurement based on information received from the phase detection circuitry; and
- determine an actual value of a measured voltage based on the coarse voltage measurement and the fine voltage measurement.

10. The apparatus of claim 9, wherein the controller is further configured to activate the quantity of delay line blocks among the plurality of delay line blocks comprising the first quantity of circuit elements such that each phase detector circuit of the phase detection circuitry is enabled to determine either a positive phase or a negative phase from signaling received via the plurality of taps.

11. The apparatus of claim 10, wherein the controller is further configured to determine the fine voltage measurement based on a quantity of phase detector circuits that have a positive phase associated therewith and a quantity of phase detector circuits that have a negative phase associated therewith.

12. The apparatus of claim 9, wherein the apparatus is resident on a System-on-Chip (SoC), and wherein the controller is configured to utilize the actual value of the measured voltage in connection with operation of the SoC to alter an amount of power used by the SoC.

13. The apparatus of claim 9, wherein the apparatus is resident on a System-on-Chip (SoC), and wherein the controller is configured to utilize the actual value of the measured voltage in connection with operation of the SoC to provide a regulated power signal to one or more components of the SoC.

14. The apparatus of claim 9, wherein the second quantity of circuit elements is greater than the first quantity of circuit elements.

15. A method, comprising:
- measuring, by a voltage tracking controller, a first voltage that is based on a quantity of active delay line blocks among a plurality of delay line blocks communicatively coupled to the voltage tracking controller via a phase detector (PD) delay line block that is coupled to the plurality of delay line blocks and phase detection circuitry comprising a plurality of phase detector circuits that is coupled to the PD delay line block;
- measuring, by the voltage tracking controller, a second voltage based on information received from the phase detection circuitry; and
- determining, by the voltage tracking controller, a measured voltage based on the first measured voltage and the second measured voltage.

16. The method of claim 15, further comprising activating a subset of the delay line blocks among the plurality of delay line blocks such that each phase detector circuit of the phase detection circuitry determines both a positive phase and a negative phase from signaling received via the PD delay line block or the phase detection circuitry, or both.

17. The method of claim 15, further comprising measuring the first voltage based on a quantity of phase detector circuits that have a positive phase associated therewith and a quantity of phase detector circuits that have a negative phase associated therewith.

18. The method of claim 15, further comprising measuring the second voltage based on a cross-point between a negative phase of at least a first phase detector circuit of the phase detection circuitry and a positive phase of at least a second phase detector circuit of the phase detection circuitry.

19. The method of claim 15, further comprising receiving, by the phase detection circuitry, signaling from the PD delay line block via respective taps, wherein a quantity of circuit elements of the PD delay line block coupled to the respective taps is less than a quantity of phase detector circuits of the phase detection circuitry coupled to the respective taps.

20. The method of claim 15, further comprising utilizing the determined measured voltage in connection with operation of a System-on-Chip (SoC) to provide a regulated power signal to one or more components of the SoC.

* * * * *